United States Patent
Allor et al.

(10) Patent No.: US 10,017,946 B2
(45) Date of Patent: Jul. 10, 2018

(54) ROOF MEMBRANE BONDING PLATE MARKING TOOL

(71) Applicant: OMG, Inc., Agawam, MA (US)

(72) Inventors: David H. Allor, Northborough, MA (US); Richard L. Belinda, Westfield, MA (US); Tamilselvan Samiappan, Simsbury, CT (US); Joshua S. Kelly, Longmeadow, MA (US); Stanley W. Choiniere, Southwick, MA (US); Tad A. Weiss, Westhampton, MA (US)

(73) Assignee: OMG, Inc., Agawam, MA (US)

( * ) Notice: Subject to any disclaimer, the term of this patent is extended or adjusted under 35 U.S.C. 154(b) by 0 days.

(21) Appl. No.: 15/447,924

(22) Filed: Mar. 2, 2017

(65) Prior Publication Data

US 2017/0254090 A1    Sep. 7, 2017

Related U.S. Application Data

(60) Provisional application No. 62/302,317, filed on Mar. 2, 2016.

(51) Int. Cl.
    *B05C 5/02* (2006.01)
    *E04D 15/00* (2006.01)
    (Continued)

(52) U.S. Cl.
    CPC ............ *E04D 15/00* (2013.01); *B05B 7/0093* (2013.01); *B05B 9/007* (2013.01); *B05B 13/005* (2013.01);
    (Continued)

(58) Field of Classification Search
    CPC ......... E04D 15/00; E04D 15/04; B05C 1/027; B05C 1/16; B05C 5/02; B65D 83/203;
    (Continued)

(56) References Cited

U.S. PATENT DOCUMENTS 6,229,127 B1    5/2001  Link
2013/0122186 A1*  5/2013  Hoppel ................. B05B 12/12
                                                    427/8
(Continued)

FOREIGN PATENT DOCUMENTS

| EP | 1074674 A2 | 2/2001 |
| GB | 2325982 A | 12/1998 |
| JP | 2009046860 A | 3/2009 |

OTHER PUBLICATIONS

International Search Report and Written Opinion dated May 12, 2017 (PCT/US2017/020415).

*Primary Examiner* — Laura Edwards
(74) *Attorney, Agent, or Firm* — Alix, Yale & Ristas, LLP

(57) ABSTRACT

A tool for marking the location of a bonding plate concealed beneath a roof membrane. The tool has a magnetic attraction to the bonding plate and causes a marking assembly to vertically lower toward the roof membrane and rotate on an axle. Rotation of the marking assembly and vertical lowering causes the marking implement to come into contact with the roof membrane at a location corresponding to the location of the bonding plate beneath the roof membrane. A brake restricts the rotation of the marking assembly on the axle by coming into contact with an inner edge of a chassis. Contact between the marking implement and the roof membrane and the restriction of rotation of the marking assembly by the brake cause the marking implement to create a visible mark at a position corresponding to the location of the bonding plate beneath the roof membrane.

15 Claims, 7 Drawing Sheets

(51) Int. Cl.
*B05B 15/00* (2018.01)
*B05B 7/00* (2006.01)
*B05B 13/00* (2006.01)
*B65D 83/20* (2006.01)
*B05B 9/00* (2006.01)
*E04D 15/04* (2006.01)
*B05C 1/02* (2006.01)
*B05C 1/16* (2006.01)
*E01C 23/22* (2006.01)

(52) U.S. Cl.
CPC ............... *B05B 15/00* (2013.01); *B05C 5/02* (2013.01); *B65D 83/203* (2013.01); *E04D 15/04* (2013.01); *B05C 1/027* (2013.01); *B05C 1/16* (2013.01); *E01C 23/227* (2013.01)

(58) Field of Classification Search
CPC ..... B05B 15/00; B05B 13/005; B05B 7/0093; B05B 9/007; E01C 23/227
USPC .......... 52/749.12; 81/45; 116/204, 209, 211; 118/264, 323; 222/174, 192, 608, 611.1, 222/185.1; 239/525, 147, 150, 154, 722, 239/71
See application file for complete search history.

(56) References Cited

U.S. PATENT DOCUMENTS

2014/0048624 A1* 2/2014 Olsson ................. B65D 83/203
239/375
2014/0345806 A1 11/2014 Gasser et al.
2015/0284960 A1 10/2015 Bleibler \* cited by examiner

ROOF MEMBRANE BONDING PLATE MARKING TOOL

BACKGROUND

The disclosure relates to membrane roofing systems and more particularly to a tool for marking locations on a roof membrane corresponding to bonding plates concealed below the roof membrane.

A bonding plate is a metal plate, typically made of steel, partially coated with adhesive and used to secure a roof membrane to a roof structure. The bonding plate is held in place by fasteners that extend through the bonding plate and a rigid insulation layer (if present) to engage a roof deck. The adhesive is heat activated (hot melt) and located on a raised, annular platform of the bonding plate which surrounds a recess for the fastener. The plates are heated using an induction heating apparatus that generates a high frequency oscillating magnetic field. The magnetic field penetrates the roof membrane and induces heating of the bonding plate. The heat activates the adhesive such that it affixes the bonding plate to the underside of the roof membrane. After heating, as the roof membrane and bonding plate cool, a powerful magnet is typically placed atop the roof membrane at the location of the bonding plate to assist in adhesion between the roof membrane and the bonding plate. The heating apparatus is then be moved to another bonding plate while previously heated bonding plates are allowed to cool with pressure applied to the roof membrane and the bonding plate.

Roof membranes are produced in varying thicknesses, ranging from 30 to 80 mils and are manufactured from different materials including TPO, EPDM and PVC. Some roof membranes may be layered in construction, having specific materials at different depths to attain a desired membrane property.

Clearly identifying the location of each bonding plate beneath the roof membrane is critical to ensuring that each plate is heated and pressed while cooling to establish a high-integrity bond between the roof membrane and the bonding plate. However, once the roof membrane is laid down atop the bonding plates, the bonding plates are effectively concealed and can be difficult to locate. The thickness, composition, material and ambient temperature all impact the flexibility of the roof membrane and the visibility of the bonding plate. When temperatures are warm and the roof membrane is thin, the roof membrane is pliable and drapes over the slightly raised bonding plates in a manner that may allow the contours of the bonding plates to be visible by eye through the roof membrane. When temperatures are cooler and the roof membrane is thicker, the membrane can be stiff, making bonding plates nearly impossible to visually detect. Under these circumstances, workers may use their shoes to scuff the surface of the roof membrane to determine the location of the bonding plates. Methods such as this can damage the roof membrane and can be extremely inefficient.

Therefore, there is a need for an apparatus that can assist workers in detecting and marking locations on a roof membrane corresponding to the location of bonding plates positioned beneath the roof membrane.

SUMMARY

In the illustrated embodiment, a roof membrane bonding plate marking tool (hereinafter, "tool") is disclosed. The tool is for marking the location of bonding plates positioned beneath a roof membrane. The tool comprises a chassis defining an interior that is open toward the roof membrane. The chassis is moveable on a plurality of wheels and includes a handle assembly for pushing or pulling the tool atop the roof membrane. The chassis also includes a rectangular inner edge defining an opening. A marking assembly is situated within the inner edge of the chassis and projects toward the roof membrane. The marking assembly is rotatable on an axle and includes at least one brake, at least one magnet and at least one marking implement adjacent the magnet.

A magnetic attraction between the magnet and the bonding plate causes the marking assembly to respond to the presence of the bonding plate by vertically lowering toward the roof membrane and rotating on the axle. Rotation of the marking assembly and vertical lowering causes the marking implement to come into contact with the roof membrane at a location corresponding to the location of the bonding plate beneath the roof membrane. The brake restricts the rotation of the marking assembly on the axle by coming into contact with the inner edge of the chassis. Contact between the marking implement and the roof membrane and the restriction of rotation of the marking assembly by the brake cause the marking implement to create a visible mark at a position corresponding to the location of the bonding plate beneath the roof membrane. In this manner, the tool establishes an efficient way to detect and mark the location of bonding plates concealed beneath a roof membrane.

DETAILED DESCRIPTION

Figure 1:
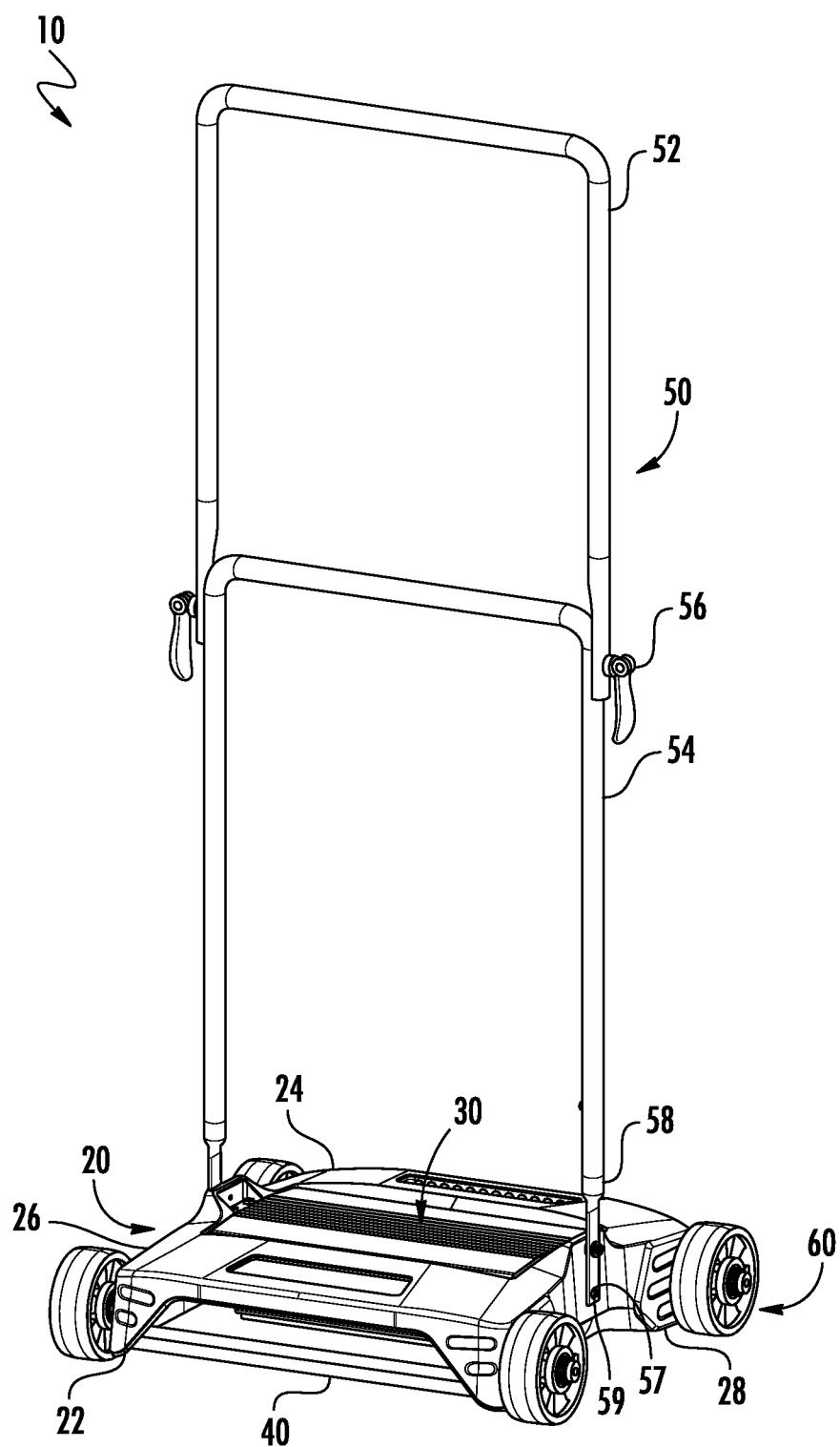
FIG. 1 is a front perspective view of one disclosed embodiment of the tool according to aspects of the disclosure.

An embodiment of the tool according to aspects of the disclosure will now be described with reference to FIGS. 1-4G, wherein like numerals represent like parts. The tool will generally be referred to by the reference numeral 10. Various materials, methods of construction, methods of manufacture, and methods of fastening will be discussed in the context of the disclosed embodiment. Those skilled in the art will recognize known substitutes for the materials, manufacturing methods, and fastening methods, all of which are contemplated as compatible with the disclosed embodiment and are intended to be encompassed by the appended claims.

As shown in FIG. 1, the tool 10 comprises a chassis 20, a marking assembly 30, a leading and trailing sweeping member 40, 42, a handle assembly 50 and wheels 60. The chassis 20 is generally symmetrical having a front 22 and a rear 24 and opposing sides 26, 28 extending therebetween. The chassis is constructed of a die cast aluminum, but other materials and methods of manufacture are compatible with the disclosed tool 10. There are two wheels 60 fastened to an exterior of the sides 26, 28 of the front 22 of the chassis 20 and two wheels 60 fastened to the exterior of the sides 26, 28 of the rear 24 of the chassis 20.

The handle assembly 50 extends above the chassis 20 and includes a U-shaped upper handle 52, a U-shaped lower handle 54, two handle mounts 58 and two or more spring plungers 59. The upper and lower handles 52, 54 are fastened together with a pair of cam levers 56. The handle assembly 50 is fastened to the exterior of the sides 26, 28 of the chassis 20 by each handle mount 58. The wheels 60 and each handle mount 58 are fastened to the chassis 20 with screws. Each spring plunger 59 extends through each side 26, 28 of the chassis 20. Each handle mount 58 includes a hole 57 that couples with the spring plungers 59 to lock the handle assembly 50 into a pre-determined position. The handle assembly 50 is removable from the chassis 20 by unfastening each handle mount 58. By pushing the handle assembly 50, an operator causes the tool 10 to move in a forward direction along the surface of the roof membrane 200 (shown in FIGS. 4A-4F). By pulling the handle assembly 50, the operator causes the tool 10 to move in a backward direction along the surface of the roof membrane 200.

Figure 2:
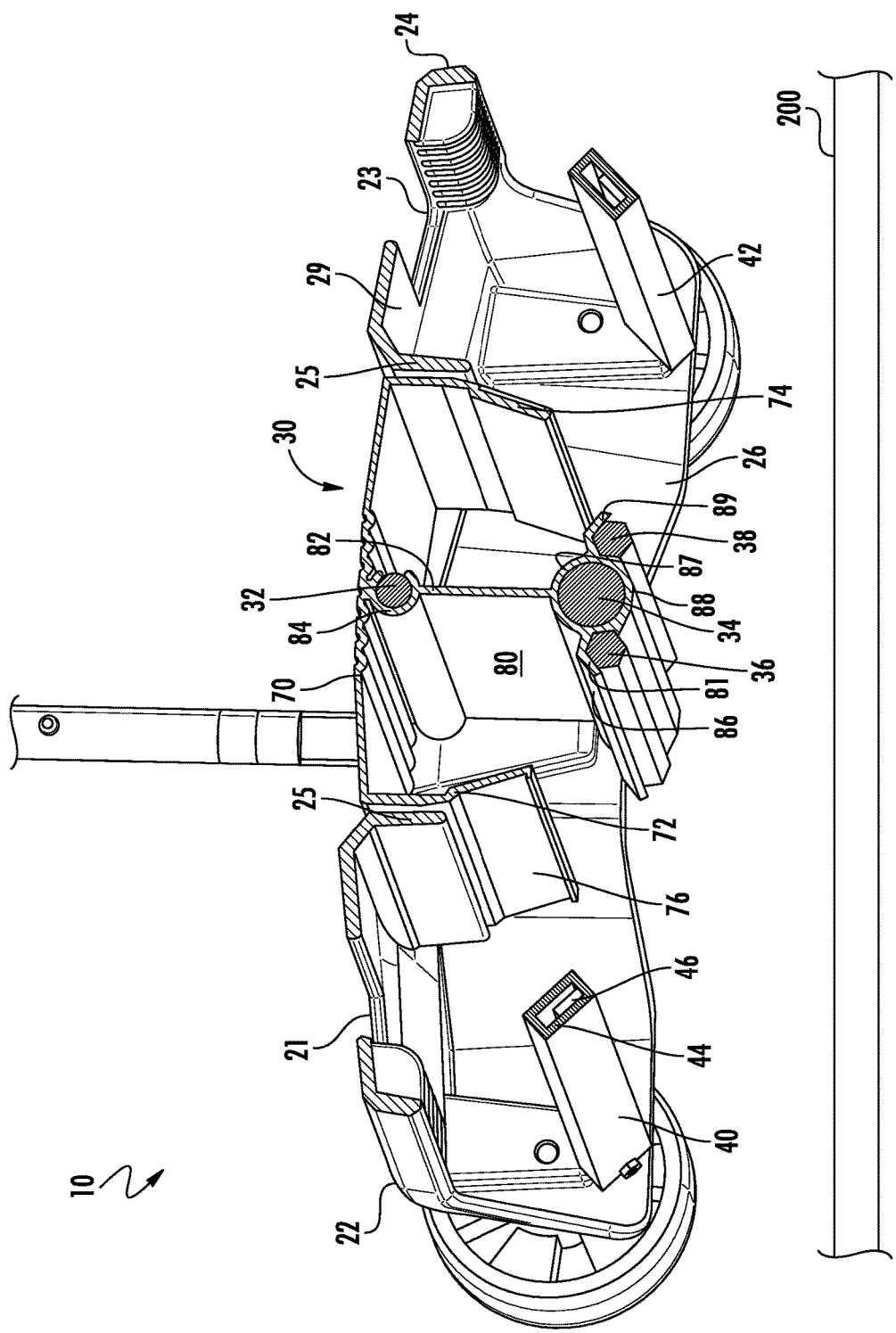
FIG. 2 is a cross-sectional side view of the disclosed embodiment of FIG. 1.

As shown in FIG. 2, the chassis 20 defines a hollow convex interior 29 which is open toward the roof membrane 200. A front and rear aperture 21, 23 extends across the chassis 20 between the sides 26, 28 to aid in lifting the tool 10. A rectangular inner edge 25 defines an opening for accommodating the mark assembly 30 between the first and second apertures 21, 23. The sweeping members 40, 42 extend across and are fastened to the interior 29 of the sides 26, 28 of the chassis 20. Each sweeping member 40, 42 comprises a hollow elongated aluminum beam 44 surrounding a magnet 46. The sweeping members 40, 42 are configured to attract and collect ferromagnetic materials, such as loose screws and metal filings that are present on and could cause damage to the roof membrane 200. The sweeping members 40, 42 are angled such that accumulation of collected ferromagnetic materials does not come in contact with the roof membrane 200.

The marking assembly 30 is situated within the inner edge 25 of the chassis 20. The marking assembly 30 includes an extruded frame 70 rotatable on an axle 32 and vertically moveable in relation to the chassis 20. The marking assembly 30 further comprises at least one bonding plate detector 34, a replaceable first marking implement 36 and a replaceable second marking implement 38. The frame 70 includes a leading and trailing brake 72, 74 and a marking extension 80. The brakes 72, 74 are each comprised of a pad 76 coupled to a panel of the frame 70 extending down toward the roof membrane 200. In the disclosed embodiment, the pad 37 is a foam pad. The brakes 72, 74 restrict the rotation of the frame 70 when the pad 76 comes into contact with the inner edge 25 of the chassis 20. It is preferred that rotation of the frame 70 is restricted to less than 25°. In the disclosed embodiment, rotation of the frame 70 is restricted to 10°. The thickness of the pad 76 can be changed to adjust the range of rotation of the frame 70. The pad 76 also reduces the amount of noise and vibration created by contact between the brakes 72, 74 and the inner edge 25 of the chassis 20.

The marking extension 80 includes an arm 82 extending down toward the roof membrane 200 from a pivot 84. The pivot 84 receives the axle 34 at a center of the frame 70. The arm 82 extends down to a first slot 86 for holding the first marking implement 36, a middle bore 87 for receiving the detector 34 and a second slot 89 for holding the second marking implement 38. In the disclosed embodiment, it is preferred that the middle bore 87 be adjacent to the first and second slots 86, 89 to increase efficiency of the marking assembly 30. The middle bore 87 is not limited to any single shape. The middle bore 87 substantially surrounds the detector 34 to reduce the tendency of the detector 34 to pick-up unintended materials such as loose screws and metal filings. The marking extension 80 has a beveled bottom surface 88 to prevent damage to the roof membrane 200.

In the disclosed embodiment, the detector 34 is comprised of at least one neodymium rare earth magnet having a pull force of greater than 25 pounds, but other magnets such as a manufactured magnet or an electromagnet are compatible with the tool 10. In the disclosed embodiment, the detector 34 has a pull force of 68 pounds. Further, as shown in FIGS. 4F and 4G, the detector 34 is configured such that there is a vertical magnetic field (B) in the direction of a bonding plate 100, as contrasted to a typical bar magnet having a magnetic field along its length. The vertical magnetic field (B) provides an improved pull force acting on the bonding plate 100 without accumulating unintended materials on ends of the detector 34.

The slots 86, 89 surround a majority of the circumference of the marking implements 36, 38 and include triangular radially inward projecting teeth 81 for securing the marking implements 36, 38. In the disclosed embodiment, the marking implements 36, 38 are hexagonal construction crayons, but other materials and methods capable of producing a mark on a surface are compatible with the tool 10. It is contemplated that the marking implements 36, 38 may comprise a marking reservoir filled with a marking material connected to a porous applicator, such as a felt, a pad, a brush, or the like. Alternatively, the marking implements 36, 38 may comprise a pressure delivery system, such as a spray can or bottle that delivers the marking material through one or more orifices. In a further alternative, the marking implements 36, 38 may comprise a print head which generates pressure in response to electrical signals, such as a dot matrix print head of the kind used to mark products coming off an assembly line.

It is preferred that the marking material change color when heated by an induction heating tool. For example, the marking material may appear red when applied by the tool 10, but when heated above a threshold temperature such as 300° F., the marking material turns green. The threshold color-change temperature may be selected high enough that normal conditions on the roof will not be high enough to change the color of the visible mark. A typical heat bonding cycle will raise the temperature of the bonding plate 100 and roof membrane 200 to approximately 400° F. for a short period of time, providing a range of temperatures that are available above normal temperatures, even in southern climates in summer, when temperatures on a flat roof rarely exceed 200° F. The operator of the tool 10 will be able to clearly see the location of each bonding plate 100 as an aid in positioning the induction bonding tool and will also be provided with a clear visual indication that each bonding plate 100 has been exposed to a heat bonding cycle due to the change in color of the marking material. This helps to ensure that each bonding plate 100 is bonded to the roof membrane 200. Powdered minerals or other compounds may be identified or blended to have the desired color-change attributes. Powdered materials may then rinse off the roof membrane 200 or be temporarily lightly bonded to the roof membrane 200 with water soluble substances.

Figure 3:
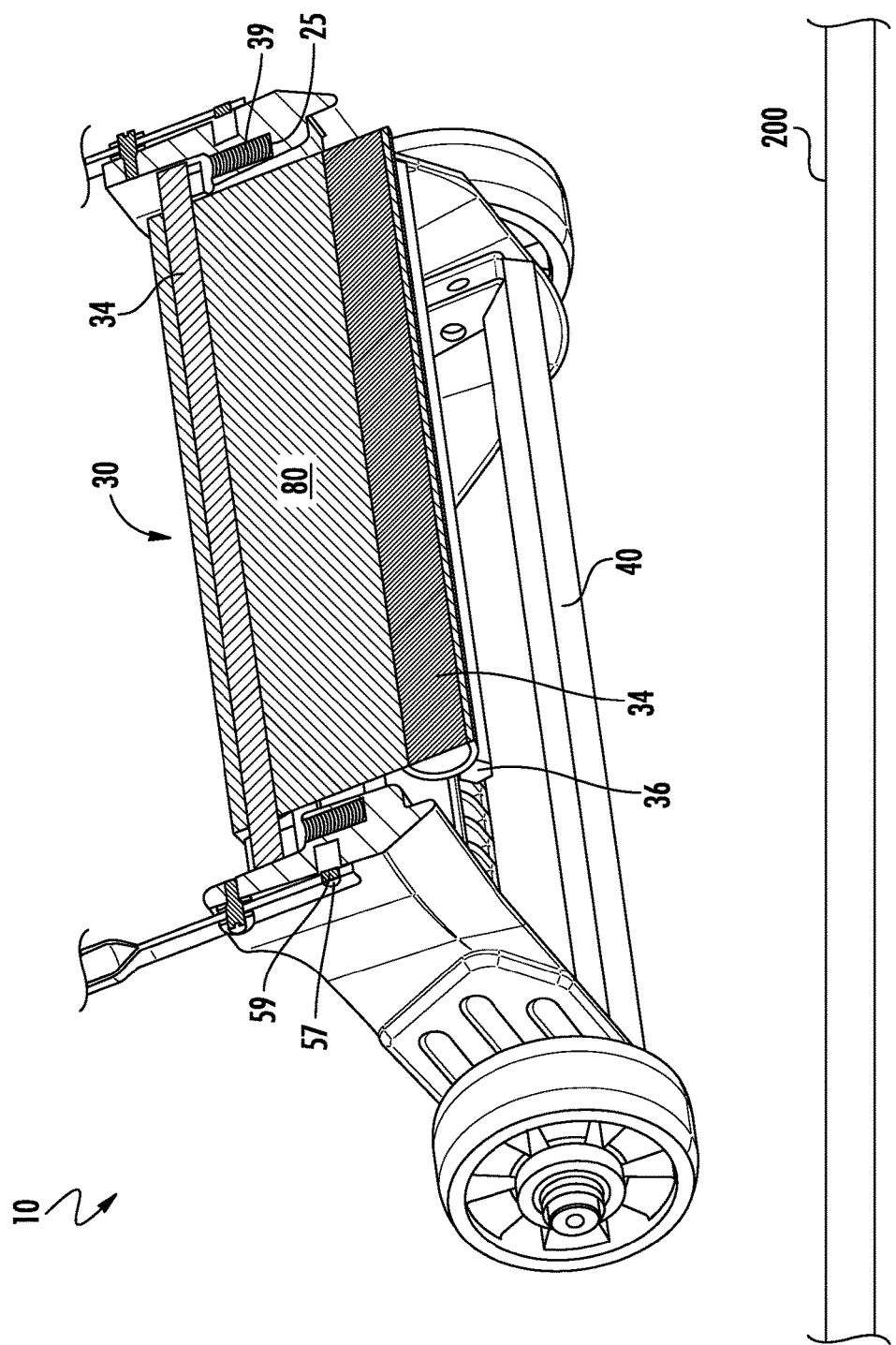
FIG. 3 is a cross-sectional rear view of the disclosed embodiment of FIG. 1.
Figure 4A:
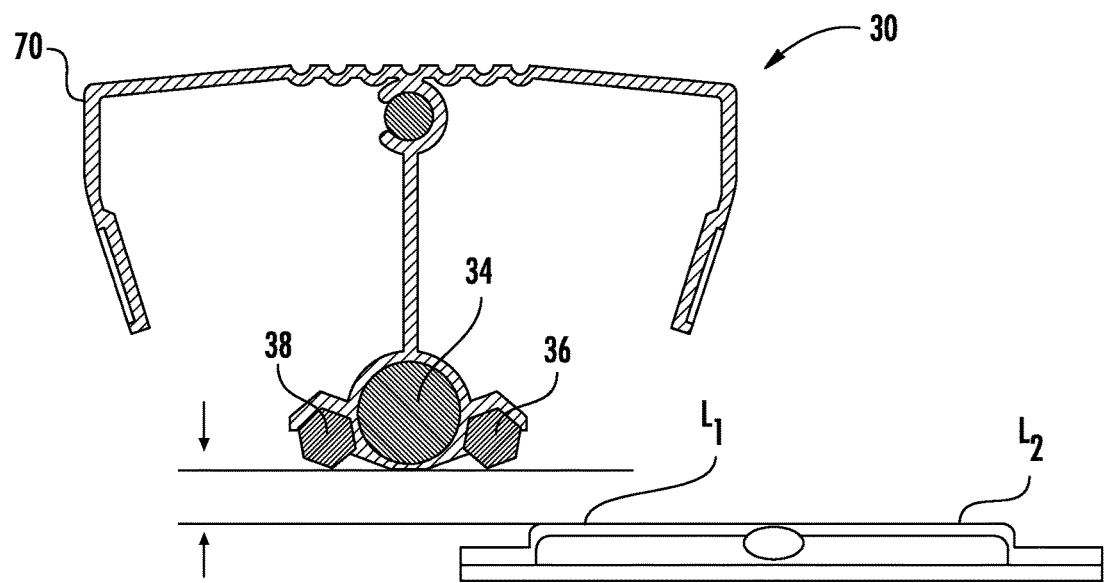
FIGS. 4A-4F (not drawn to scale) are front views of a marking assembly shown in various marking and non-marking positions according to aspects of the disclosure.

As shown in FIG. 4A, the marking assembly 30 is biased toward a first non-marking position by a pair of bias members 39. As shown in FIG. 3, each bias member 39 is situated in a pocket 25 on the interior 29 of each side 26, 28 of the chassis 20. The bias members 39 are selected to support the weight of the marking assembly 30 to bias the marking assembly 30 toward the first non-marking position, shown in FIGS. 4A and 4G. In the disclosed embodiment, each bias member 39 is a coil spring but other biasing mechanisms are compatible with the tool 10. A T-shaped plug (not shown) is received in an upper end of each bias member 39 to aid in supporting and stabilizing the axle 32. Each end of the axle 32 is positioned atop each T-shaped plug.

As shown in FIG. 4A, in the first non-marking position, it is preferred that the marking implements 36, 38 are oriented at a pre-determined position of less than 0.50 inches away from the roof membrane 200. In the disclosed embodiment, the marking implements 36, 38 are oriented at a pre-determined position of 0.17 inches away from the roof membrane 200. In the first non-marking position, the marking extension 80 is perpendicular to the roof membrane 200. A typical bonding plate 100 has a preferred height of less than 0.50 inches. In the disclosed embodiment, the height the bonding plate 100 is 0.17 inches. The marking assembly 30 is biased toward the first non-marking position with a spring force less than the down force generated by the detector 34 when the tool 10 passes over the bonding plate 100 beneath the roof membrane 200. The force generated by the magnetic attraction of the detector 34 to the bonding plate 100 beneath the roof membrane 200 is sufficient to overcome the bias toward the first non-marking position.

Figure 4B:
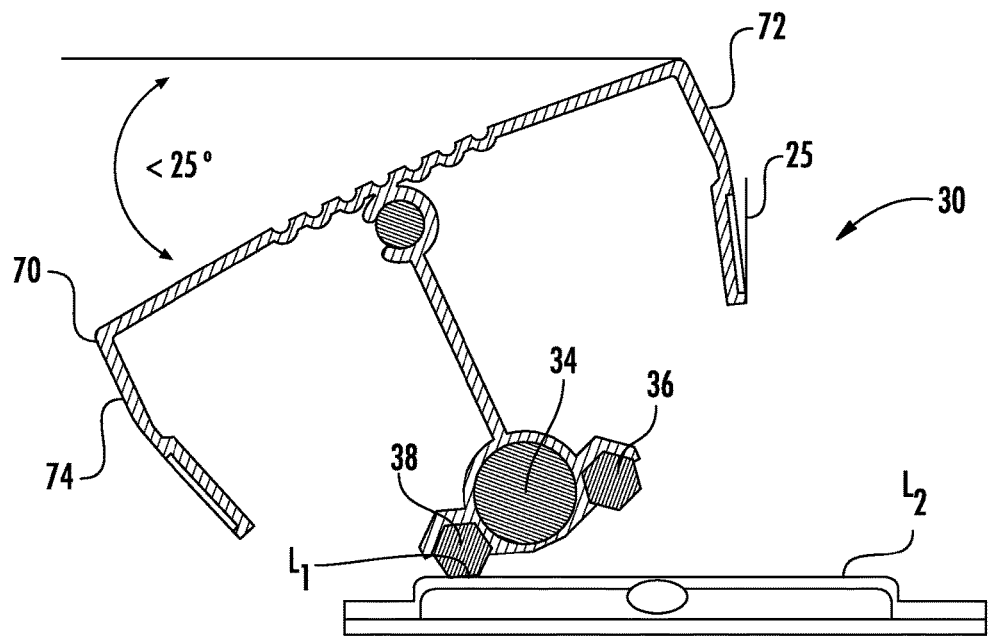

As shown in FIGS. 4A and 4B, as the tool 10 moves over the position of the bonding plate 100, the detector 34 begins to be attracted to the bonding plate 100 and moves toward the bonding plate 100. Movement of the detector 34 toward the bonding plate 100 causes the bias members 39 to compress and the frame 70 to lower closer to the roof membrane 200.

As shown in FIG. 4B, in a first marking position, the second marking implement 38 is the first part of the marking assembly 30 to come into contact with the roof membrane 200 at a location $L_1$ on the roof membrane 200 corresponding to the location of the bonding plate 100 below the roof membrane 200. In the first marking position, it is preferred that the frame 70 is rotated in a counterclockwise direction and restricted to less than 25° of rotation by the leading brake 72. In the disclosed embodiment, the frame 70 is restricted to 10° of rotation in the counterclockwise direction. In the first marking position, the second marking implement 38 drags on the roof membrane 200 and creates an indiscriminate smudge-like visible mark on the roof membrane 200 at location $L_1$.

Figure 4C:
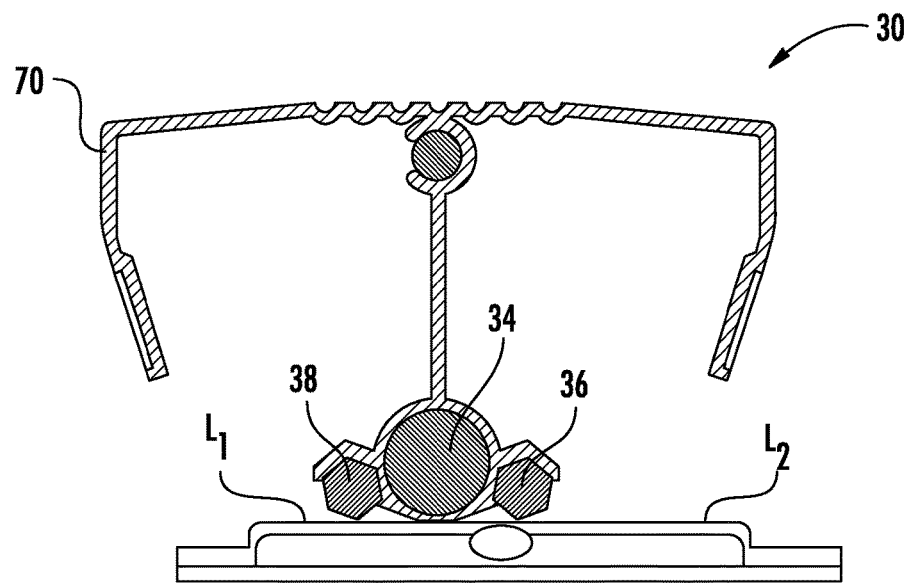

As shown in FIG. 4C, as the tool 10 continues forward, in a second marking position, the beveled bottom surface 88 of the marking extension 80 begins to roll on the bonding plate 100 as the detector 34 pulls the frame 70 toward the bonding plate 100. In the second marking position, the beveled bottom surface 88 is predominantly in contact with the roof membrane 200.

Figure 4D:
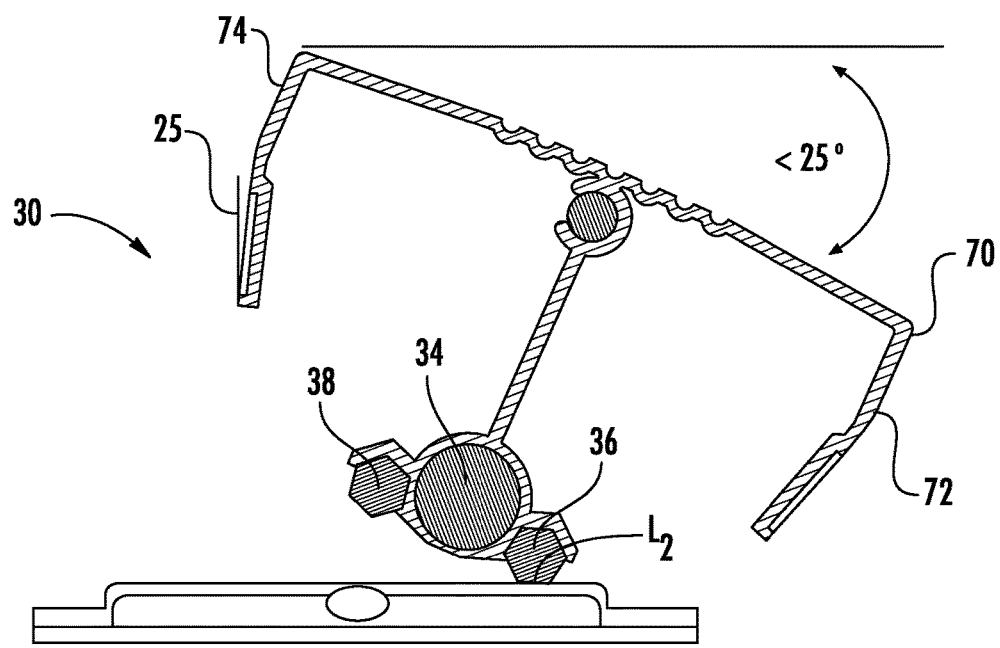

As shown in FIG. 4D, as the tool 10 moves over the bonding plate 100, in a third marking position, the first marking implement 36 comes into contact with the roof membrane 200 at a location $L_2$ corresponding to the location of the bonding plate 100 below the roof membrane 200. In the third marking position, the frame 70 is rotated in a clockwise direction and restricted less than 25° of rotation by the trailing brake 74. In the third marking position, the first marking implement 36 drags on the roof membrane 200 and creates an inverted C-shaped visible mark on the roof membrane 200 at the location $L_2$.

Figure 4E:
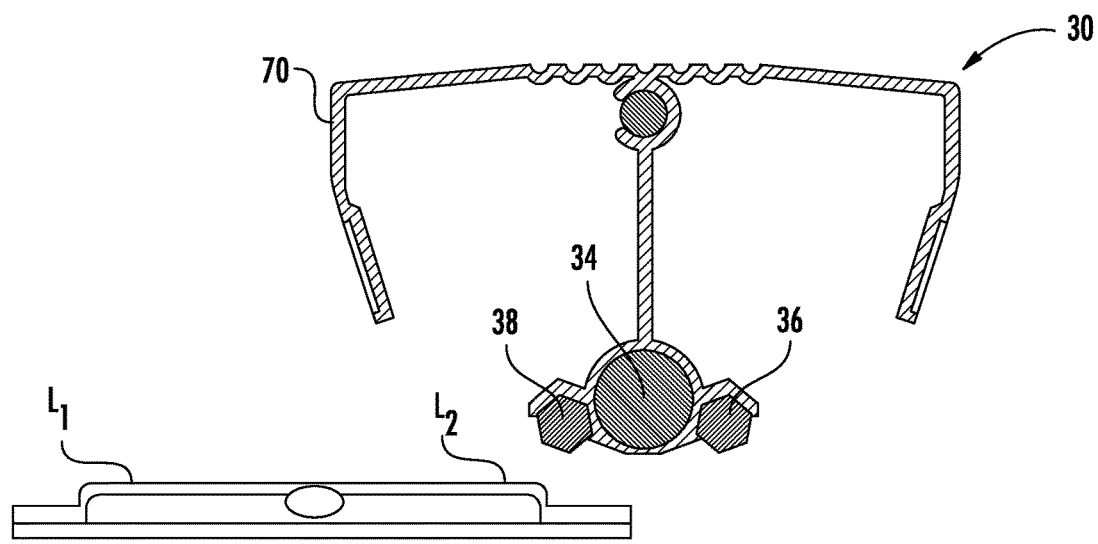
Figure 4F:
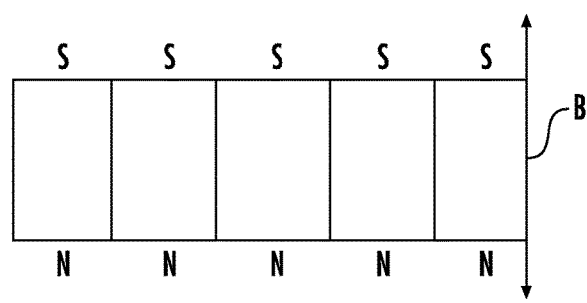
Figure 4G:
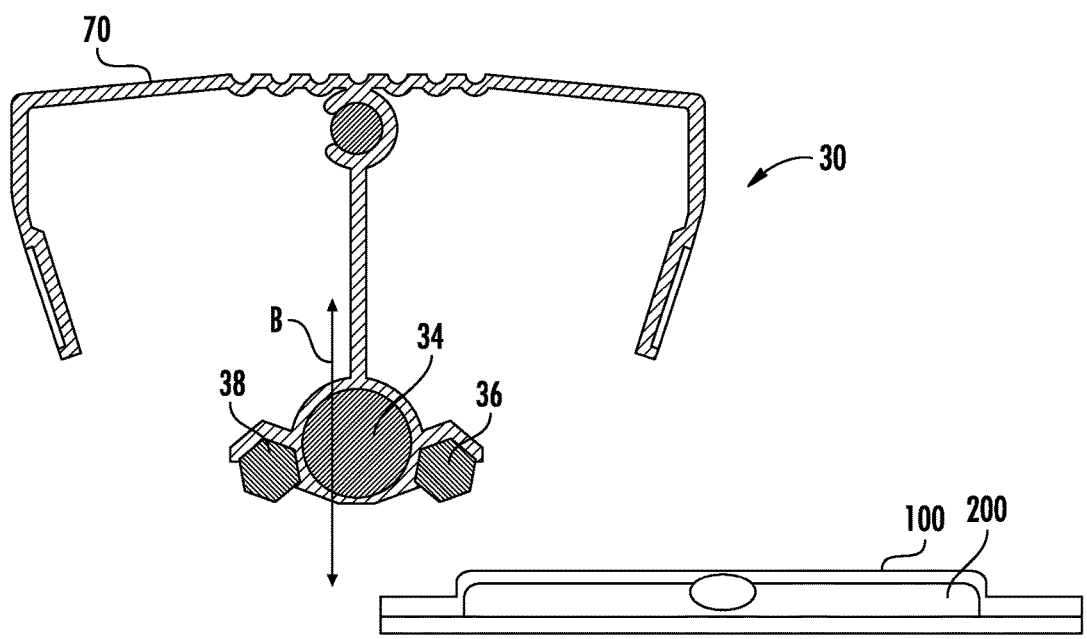
FIG. 4G (not drawn to scale) is a magnet showing particular emphasis on a vertical magnetic field (B) according to aspects of the disclosure.

As shown in FIG. 4E, when the bonding plate 100 is no longer within the magnetic field of the detector 34, the marking assembly 30 rotates less than 25° in a counterclockwise direction back to a second non-marking position identical to the first marking position.

What is claimed:

1. A tool for marking the location of bonding plates positioned beneath a roof membrane, the tool comprising:
   a chassis defining an interior, the interior open toward the roof membrane;
   a handle assembly and a set of wheels fastened to the chassis;
   a marking assembly situated within the chassis having at least one bonding plate detector and at least one marking implement projecting toward the roof membrane,
   wherein, the marking assembly responds to the presence of a bonding plate positioned beneath the roof membrane by moving the marking implement into contact with the roof membrane and creating a visible mark at a location on the roof membrane corresponding to the position of the bonding plate positioned beneath the roof membrane.

2. The tool of claim 1, wherein the marking assembly comprises at least one magnet adjacent to the marking implement, the magnet responding to the presence of the bonding plate and moving the marking implement into contact with the roof membrane, said contact between the marking implement and the roof membrane resulting in a visible mark at the location corresponding to the position of the bonding plate.

3. The tool of claim 1, wherein the marking assembly comprises a frame rotatable on an axle, at least one brake, at least one magnet and at least one marking implement.

4. The tool of claim 1, wherein the marking assembly includes a brake, the brake restricting rotation of the frame to less than 25°.

5. The tool of claim 1, wherein the marking assembly includes a magnet, the magnet having a pull force greater than 25 pounds.

6. The tool of claim 1, wherein at least one sweeping member extends across the interior of the chassis, the sweeping member including a magnet.

7. The tool of claim 1, wherein the marking assembly includes a frame, a pair of bias members and a magnet, said bias members biasing the frame toward a non-marking position and said magnet having a pull force sufficient to overcome the bias toward a non-marking position to move the frame into a marking position.

8. A tool for marking the location of bonding plates positioned beneath a roof membrane, the tool comprising:
   a chassis moveable on a plurality of wheels and having an inner edge defining an opening;
   a marking assembly situated within the inner edge of the chassis, the marking assembly rotatable on an axle and comprising at least one brake, at least one magnet and at least one marking implement adjacent the magnet,
   wherein, a magnetic attraction of the magnet to the bonding plate causes the marking implement to come into contact with the roof membrane at a location corresponding to the bonding plate, the marking implement creating a visible mark at the location corresponding to the bonding plate.

9. The tool of claim 8, wherein the magnetic attraction of the magnet to the bonding plate causes the marking assembly to rotate on the axle and the brake restricts rotation on the axle by coming into contact with the inner edge of the chassis.

10. The tool of claim 8, wherein the magnetic attraction of the bonding plate to the magnet causes the marking assembly to rotate in a clockwise direction causing the marking implement to come into contact with the roof membrane.

11. The tool of claim 8, wherein the marking implement is a hexagonal crayon.

12. The tool of claim 8, wherein the marking assembly includes a plurality of magnets configured to have a vertical magnetic field.

13. A method of manufacturing a tool for marking the location of bonding plates positioned beneath a roof membrane, the method of manufacturing the tool comprising:
   providing a chassis defining an interior, the interior open toward the roof membrane;
   providing a handle and a set of wheels fastened to the chassis;
   providing a marking assembly having at least one marking implement and at least one bonding plate detector;
   mating a marking assembly with the chassis, the marking assembly having at least one marking implement projecting toward the roof membrane,
   wherein, the detector responds to the presence of a bonding plate positioned beneath the roof membrane by moving the marking implement into contact with the roof membrane and creating a visible mark at a location on the roof membrane corresponding to the position of the bonding plate positioned beneath the roof membrane.

14. The method of manufacturing the tool of claim 13, wherein the step of providing a chassis defining an interior includes the chassis having an inner edge defining an opening and the marking assembly is situated within the inner edge of the chassis.

15. The method of manufacturing the tool of claim 13, wherein the step of providing a marking assembly includes the marking assembly extending from the inner edge of the chassis to less than 0.50 inches above the roof membrane.

\* \* \* \* \*